United States Patent
Eineder et al.

(10) Patent No.: US 9,172,349 B2
(45) Date of Patent: Oct. 27, 2015

(54) SWITCHABLE FREQUENCY DIPLEXER CIRCUIT

(71) Applicant: Rohde & Schwarz GmbH & Co. KG, Munich (DE)

(72) Inventors: Gerhard Eineder, Munich (DE); Bernhard Richt, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 211 days.

(21) Appl. No.: 13/900,010

(22) Filed: May 22, 2013

(65) Prior Publication Data

US 2013/0314171 A1 Nov. 28, 2013

(30) Foreign Application Priority Data

May 22, 2012 (DE) .......................... 10 2012 208 555

(51) Int. Cl.
*H03H 7/46* (2006.01)
*H03H 11/34* (2006.01)
*H01P 1/15* (2006.01)

(52) U.S. Cl.
CPC ............... *H03H 7/465* (2013.01); *H03H 7/463* (2013.01); *H03H 11/344* (2013.01)

(58) Field of Classification Search
CPC ................ H01P 1/10; H01P 3/00; H01P 7/00
USPC .................. 333/101, 103, 104, 164, 167, 132
See application file for complete search history.

(56) References Cited

U.S. PATENT DOCUMENTS

| | | | | |
|---|---|---|---|---|
| 3,982,214 A | * | 9/1976 | Burns | 333/164 |
| 5,148,062 A | * | 9/1992 | Goldfarb | 327/237 |
| 5,208,564 A | * | 5/1993 | Burns et al. | 333/164 |
| 5,276,455 A | * | 1/1994 | Fitzsimmons et al. | 343/777 |
| 6,137,377 A | * | 10/2000 | Wallace et al. | 333/139 |
| 6,674,341 B2 | * | 1/2004 | Hieda et al. | 333/164 |
| 6,952,142 B2 | * | 10/2005 | Guitton et al. | 333/25 |
| 6,975,841 B2 | * | 12/2005 | Uriu et al. | 455/78 |
| 7,123,116 B2 | * | 10/2006 | Hieda et al. | 333/164 |
| 7,495,529 B2 | * | 2/2009 | Miyaguchi et al. | 333/164 |
| 7,541,894 B2 | * | 6/2009 | Miyaguchi et al. | 333/164 |
| 7,978,021 B2 | * | 7/2011 | Tamaru | 333/25 |
| 8,334,731 B2 | * | 12/2012 | Uejima | 333/101 |
| 2003/0008693 A1 | | 1/2003 | Tanaka et al. | |
| 2014/0347118 A1 | * | 11/2014 | Richt | 327/379 |

FOREIGN PATENT DOCUMENTS

| | | |
|---|---|---|
| DE | 10 2007 005 676 A1 | 4/2008 |
| DE | 10 2006 052 433 A1 | 5/2008 |
| EP | 1 780 889 A1 | 5/2007 |

OTHER PUBLICATIONS

Office Action for related German Application No. 10 2012 208 555.6, dated May 22, 2014, 8 pages (English Summary of Office Action included).

* cited by examiner

*Primary Examiner* — Dean Takaoka
(74) *Attorney, Agent, or Firm* — Ditthavong & Steiner, P.C.

(57) ABSTRACT

An electronic circuit comprises a high-pass and a low-pass. The low-pass comprises at least one low-pass series element and a low-pass transverse element. The high-pass comprises at least one high-pass series element and a high-pass transverse element. The low-pass series element and the high-pass transverse element are realised in this context by a common component, and/or the high-pass series element and the low-pass transverse element are realised in this context by a common component.

12 Claims, 4 Drawing Sheets

SWITCHABLE FREQUENCY DIPLEXER CIRCUIT

FIELD OF THE INVENTION

The invention relates to an electronic circuit for switching between two input terminals and a common output terminal, whereas the frequency ranges of the input signals advantageously overlap with a good matching at the input and at the output, and the load impedances of the disabled branch have no influence on the signal transmission.

BACKGROUND OF THE INVENTION

Switches are conventionally used in signal pathways to combine signals of different frequency ranges. However, such switches in the signal pathways provide unfavourable properties, especially in the high-frequency range. Accordingly, for example, European patent specification EP 1 780 889 B1 discloses an electronic circuit for switching between two signal pathways of different frequency ranges. The circuit shown in this context is disadvantageous because the signals guided through it are attenuated, and the load impedances of the disabled branch have an influence on the signal transmission.

Moreover, series elements, that is, circuit elements which are connected in series within the signal pathway, must be suitable for the lowest and the highest frequencies occurring. Losses in the series elements, especially at high frequencies, lead to a high attenuation in the signal transmission. Moreover, an inadequate linearity of the series elements influences the signal quality.

The invention is based upon the object of providing an electronic circuit, which allows a switching between at least two signal pathways of different, preferably overlapping frequency ranges with low attenuation and low non-linear distortions, and preferably providing a signal generator with the use of such a circuit.

SUMMARY OF THE INVENTION

An electronic circuit according to the invention comprises a high-pass and a low-pass. The low-pass comprises at least one low-pass series element and a low-pass transverse element. The high-pass comprises at least one high-pass series element and a high-pass transverse element. The low-pass series element and the high-pass transverse element are realised in this context by a common, preferably inductive component. The high-pass series element and the low-pass transverse element are realised in this context by a common, preferably capacitive component. Accordingly, it is possible to economise on components and to cause only slight disturbance to the signals.

The circuit preferably comprises a switch element, which is embodied to connect alternately a high-pass connecting point of the high-pass and a low-pass connecting point of the low-pass to ground.

By particular preference, the circuit comprises precisely one such component. In this manner, the desired filter property can be selected with minimal signal attenuation, without intervention in the signal pathway.

Only one high-pass or low-pass transverse element is influenced by the parasitic elements of the switch element. Accordingly, the qualities of the downstream filter elements are not impaired by parasitic elements of other switch elements, as is the case, for example, with EP 1 780 889 B1.

The circuit is preferably embodied in such a manner that it shows a low-pass behaviour when the high-pass connecting point is connected to ground, and that it shows a high-pass behaviour when the low-pass connecting point is connected to ground. In this manner, the desired characteristics can be adjusted in a very simple manner.

The high-pass connecting point is preferably disposed at the input-end of the high-pass series element. The low-pass connecting point is preferably disposed at the input end of the low-pass series element. Accordingly, a particularly simple circuit design can be realised.

The switch element is advantageously realised by a two-way switch or by two switches. Accordingly, a realisation of the circuit with readily available standard components is possible.

The two switches are preferably PIN diodes or field-effect transistors. Accordingly, a particularly fast switching speed with good long-term stability is possible.

By preference, the two switches are PIN diodes. The PIN diodes then each comprise one switch terminal, which is embodied to set the PIN diodes into a blocked and an open state. Accordingly, the switching can be realised with very simple switching technology.

The high-pass is preferably connected to a high-pass input terminal. The low-pass is preferably connected to a low-pass input terminal. The circuit preferably comprises a common output terminal. Accordingly, the signals can be fed into and drawn from the circuit very simply.

A signal generator according to the invention comprises a first partial signal generator, a second partial signal generator and an electronic circuit as described above. In this manner, a very simple and accurate switching between the output signals of the partial signal generators is possible.

The first partial signal generator preferably generates a first signal, while the second partial signal generator generates a second signal. An output of the first partial signal generator and an output of the second partial signal generator are preferably connected respectively either to the low-pass input terminal or to the high-pass input terminal. In this context, the electronic circuit is preferably connected to the first partial signal generator and to the second partial signal generator in such a manner that the electronic circuit processes the first signal or the second signal selectively and outputs a resulting signal at the output terminal. In this manner, a desired circuit function can be achieved without further switching components.

For example, the first partial signal generator is a direct digital signal generator, while the second partial signal generator is a signal generator based upon a phase-locked loop. Accordingly, the first signal provides a lower maximum frequency than the second signal.

BRIEF DESCRIPTION OF THE DRAWINGS

The invention is described by way of example below with reference to the drawings in which the advantageous exemplary embodiments of the invention are presented. The drawings show.

DETAILED DESCRIPTION OF THE EMBODIMENTS

The general structure and method of functioning of exemplary filter circuits are initially explained with reference to FIGS. 1 and 2. The structure and method of functioning of various exemplary embodiments of the circuit according to the invention are then explained with reference to FIG. 3 and FIG. 4. FIG. 5 shows an application. The presentation and description of identical elements in similar drawings have not been repeated in some cases.

Figure 1:
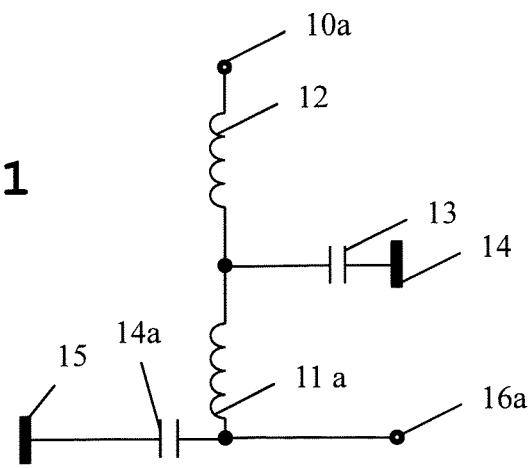
FIG. 1 an exemplary low-pass circuit.

FIG. 1 shows a circuit diagram of an exemplary low-pass circuit. An inductance 12 and an inductance 11a are disposed in series between an input terminal 10a and an output terminal 16a. The inductances 11a, 12 are series elements, that is, elements which are connected in series in the signal pathway. A capacitor 13 is connected between the inductances 12 and 11a to a ground terminal 14. Additionally, a capacitance 14a is connected to a ground terminal 15 at the output terminal 16a. The capacitors 13, 14a are transverse elements, that is, elements which are connected to ground leading away from the signal pathway.

A signal supplied at the input terminal 10a passes through the inductances 12 and 11a. Low-frequency components of the signal pass the inductances with less attenuation than high-frequency components. Additionally, high-frequency components are drained to ground 14 via the capacitors 13 and 14a. Accordingly, a low-pass characteristic is formed between the input terminal 10a and the output terminal 16a.

Figure 2:
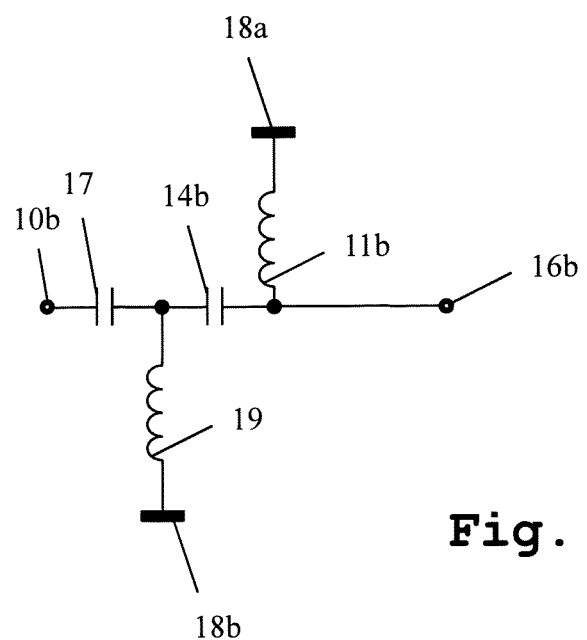
FIG. 2 an exemplary high-pass circuit.

FIG. 2 shows an exemplary high-pass circuit. The circuit comprises an input terminal 10b and an output terminal 16b. Two capacitors 14a and 17 are disposed between the input terminal 10b and the output terminal 16b. These are series elements. Furthermore, an inductance 19 is connected between the two capacitors 14b and 17 to a ground terminal 18b. Moreover, at the output terminal 16b, an inductance 11b is connected to a ground terminal 18a. The inductances 11b and 19 are accordingly transverse elements.

A signal supplied at the input terminal 10b passes through the capacitors 14b and 17. In this context, low-frequency signal components are more strongly attenuated than high-frequency signal components. Additionally, low-frequency signal components are drained to ground via the inductances 11b and 19. Accordingly, a high-pass characteristic is obtained between the input terminal 10b and the output terminal 16b.

With a conventional frequency diplexer which does not contain switches, the transmission loss at the diplexer frequency would be 3 dB, and a high error matching would occur at the input and the output. Accordingly, an overlapping of the frequency ranges is not possible.

Figure 3:
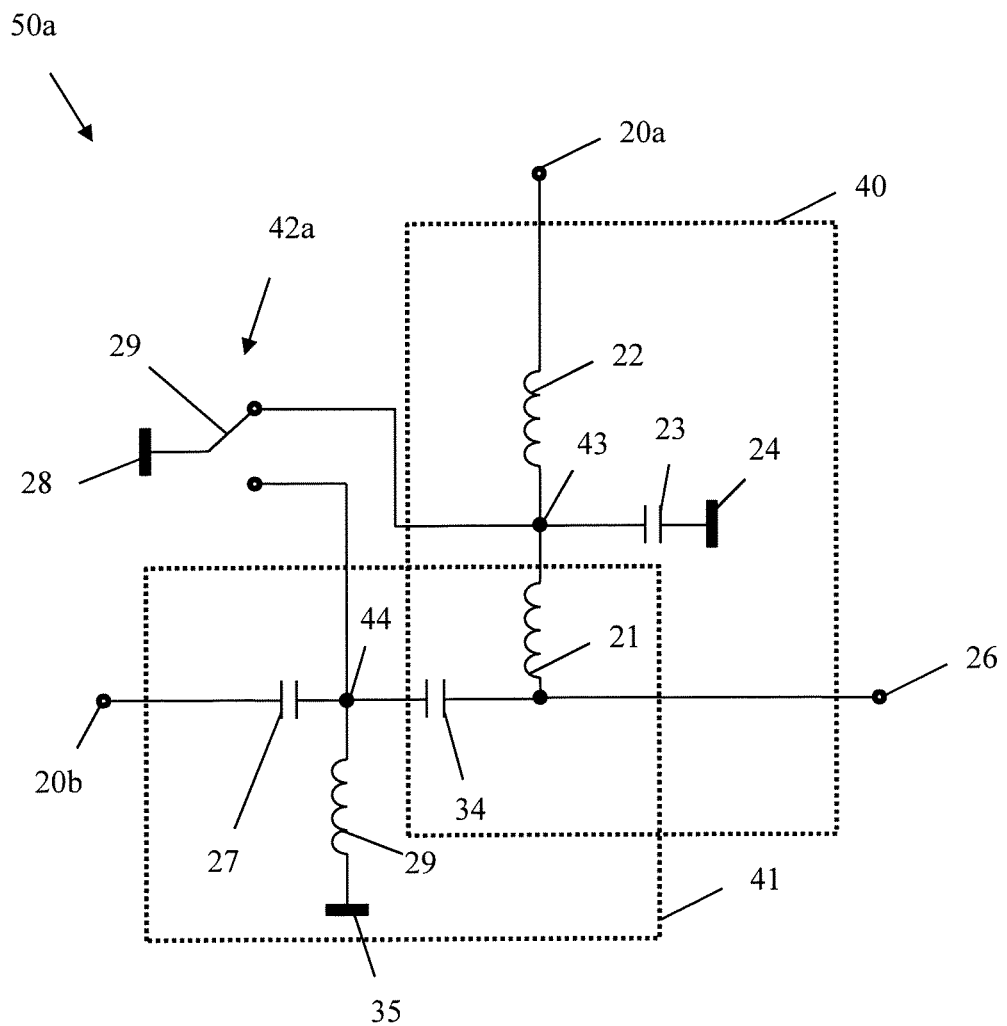
FIG. 3 a first exemplary embodiment of the circuit according to the invention.

FIG. 3 shows a first exemplary embodiment of the circuit 50a according to the invention. The circuit 50a according to the invention comprises a low-pass 40, which is connected to a low-pass input terminal 20a, a high-pass 41, which is connected to a high-pass input terminal 20b, and a common output terminal 26, which is connected to the low-pass 40 and the high-pass 41. Moreover, the circuit comprises a switch element 42a.

The low-pass 40 contains an inductance 22 and an inductance 21, which are connected in series between the low-pass input terminal 20a and the common output terminal 26. A low-pass connecting point 43, at which a capacitor 23 is provided and connected to a ground terminal 24, is disposed between the two inductances 21 and 22. The low-pass 40 further contains a capacitor 34, which is connected to the output terminal 26. The inductances 21, 22 therefore form low-pass series elements. The capacitors 23, 34 accordingly form low-pass transverse elements.

The high-pass 41 contains a capacitor 27 and the capacitor 34, which are connected in series between the high-pass input terminal 20b and the common output terminal 26. The capacitors 27, 34 are therefore high-pass series elements. Moreover, a high-pass connecting point 44 is disposed between the two capacitors 27, 34. An inductance 29 is connected to the latter and to a ground terminal 35. Moreover, the inductance 21 is connected to the output terminal 26. The inductances 29 and 21 accordingly form high-pass transverse elements.

The low-pass 40 and the high-pass 41 accordingly contain the inductance 21 and the capacitor 34 as common elements. If the high-pass 41 is active, the capacitor 34 forms a high-pass series element and the inductance 21 a high-pass transverse element. If the low-pass 40 is active, the inductance 21 forms a low-pass series element and the capacitor 34 forms a low-pass transverse element.

As a result of the double use of the inductance 21 and the capacitor 34, components of the circuit 50a can be economised. Accordingly a reduction in the cost and structural size is achieved.

The switch element 42a is used to switch between the high-pass 41 and the low-pass 40. The switch element 42a contains a two-way switch 29 which connects the low-pass connecting point 43 or the high-pass connecting point 44 selectively to a ground terminal 28.

If the low-pass connecting point 43 is connected to ground, the inductance 22 and the capacitor 23 are no longer part of the signal pathway. The inductance 21 is accordingly connected directly to ground. With this switch position, the circuit 50a according to the invention accordingly provides a high-pass characteristic. That is, the input signal is supplied to the high-pass input terminal 20b. Accordingly, in this switch position, the equivalent circuit diagram of the circuit 50a is reduced to the circuit diagram shown in FIG. 2.

If the high-pass connecting point 44 is connected to ground by the two-way switch 29, the capacitor 27 and the inductance 29 are no longer part of the signal pathway. The capacitor 34 is now connected directly to ground. The circuit 50a according to the invention accordingly provides a low-pass characteristic in this circuit position. That is to say, the input signal is supplied to the low-pass input terminal 20a. In the switch position shown here, the equivalent circuit diagram of the circuit 50a is therefore reduced to the circuit diagram illustrated in FIG. 1.

The diplexer elements can be dimensioned in such a manner that the low-pass limit frequency is greater than the high-pass limit frequency. Accordingly, the frequency ranges overlap and the transmission loss at the diplexer frequency is greater than the transmission loss of a conventional frequency diplexer.

Figure 4:
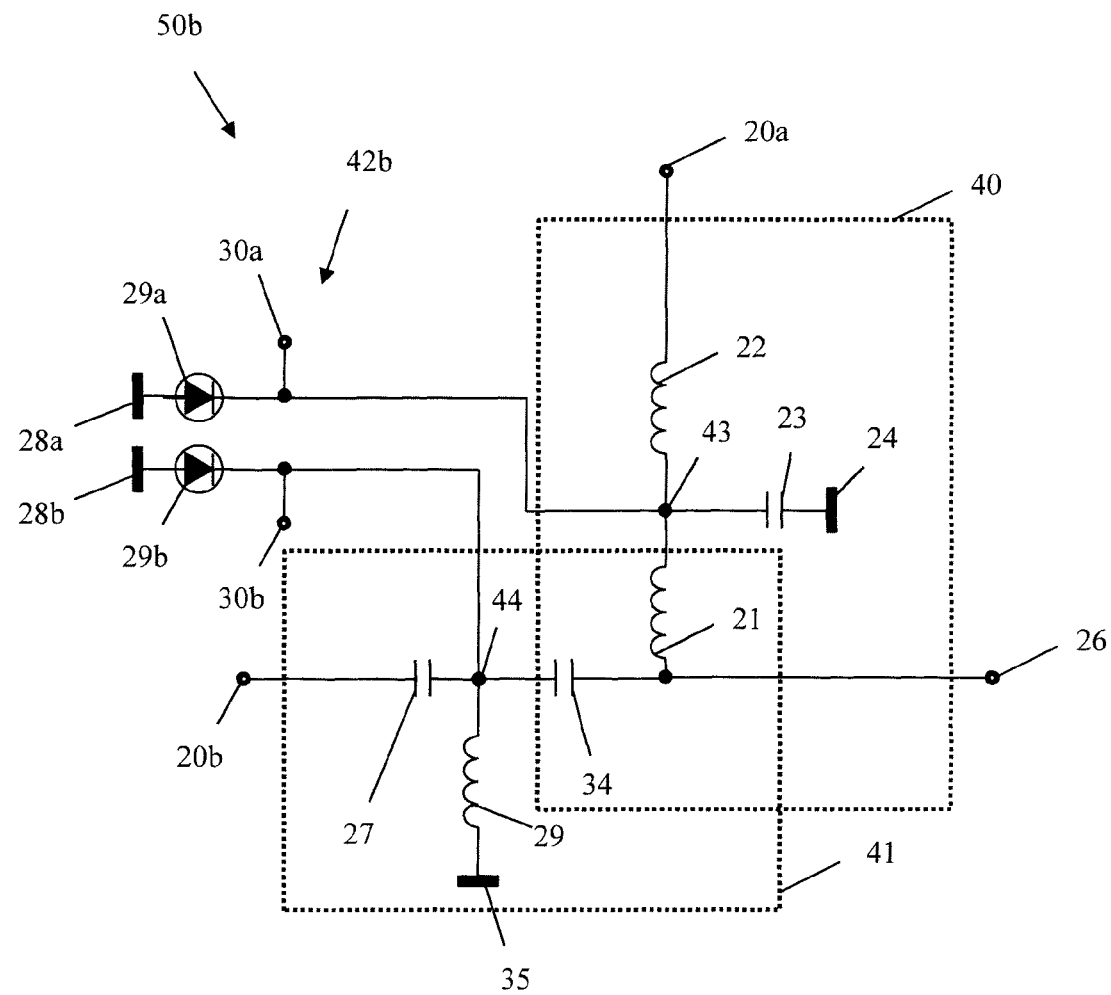
FIG. 4 a second exemplary embodiment of the circuit according to the invention.
Figure 5:
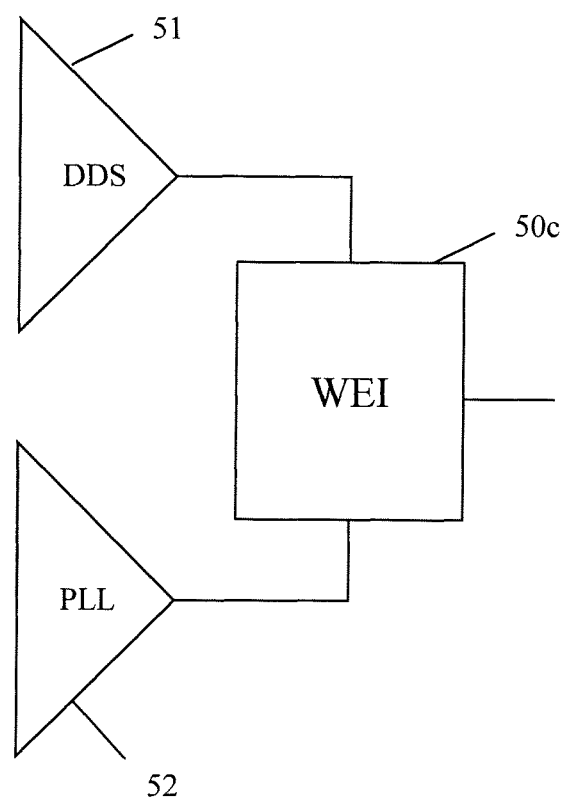
FIG. 5 an exemplary embodiment of an application of the circuit according to the invention.

FIG. 4 shows a second exemplary embodiment of the circuit 50b according to the invention. The circuit 50b here corresponds largely to the circuit 50a from FIG. 3. However, the switch element 42b, which corresponds to the switch element 42a from FIG. 3, is not realised with a two-way switch 29 but with two PIN diodes 29a and 29b, each with its own ground terminal 28a and 28b. A switching signal is supplied via switch terminals 30a, 30b to the PIN diodes 29a and 29b. In this context, the switching signals are selected in such a manner that one of the PIN diodes 29a, 29b establishes the connection to the ground terminal 28a, 28b. The respectively other PIN diode is blocked. If both PIN diodes are switched to be conductive, the signal transmission from both inputs is interrupted.

Although the PIN diodes 29a, 29b each provide parasitic inductances and capacitances, these are of subordinate significance for the function of the high-pass 41 or respectively the low-pass 40, because they are present only as transverse elements. These parasitic properties cause a slightly reduced insulation between the signal pathways and are responsible for a very slight influence of the load impedances of the disabled pathway on the signal transmission of the active pathway. For the embodiment of the actual component values of the circuits 50a, 50b illustrated in FIG. 3 and FIG. 4, it is possible to set the cut-off frequencies of the high-pass 41 and the low-pass 40 at the same frequency. By preference, a further advantageous improvement can be achieved if the cut-off frequencies of the filters overlap. This accordingly allows a continuous frequency band with an overlapping region.

Moreover, mechanical switches, for example, relays or micro-mechanical switches (MEMS) or field-effect transistors can also be used instead of a two-way switch or PIN diodes. The use of other semiconductor switches is also conceivable.

Furthermore, an additional reduction in expenditure can be achieved at the cost of a reduced filter quality by using only common-use structural elements. The currently illustrated filters are each of the second order, that is, respectively two inductances and two capacitors form the high-pass and the low-pass. Of these, one inductance and one capacitor is used in common in each case. If the order of the filter is reduced to the first order, only one inductance and one capacitor is required for the common use. In this case, the capacitors 23, 27 and the inductances 22, 29 from FIG. 3 and FIG. 4 are omitted.

FIG. 5 shows an exemplary embodiment of an application of the electronic circuits 50a and 50b from FIG. 3 or FIG. 4. A signal generator is shown here. The signal generator contains a first partial signal generator 51 and a second partial signal generator 52. The first partial signal generator 51 generates frequency less than or equal to the diplexer frequency. By preference this is a direct digital synthesiser. The second partial signal generator 52 generates frequencies greater than the diplexer frequency. By preference it is based on a phase-locked loop. The first partial signal generator 51 accordingly generates a first signal of significantly lower frequency than a second signal generated by the second partial signal generator. Outputs of these partial signal generators 51, 52 are connected respectively to the inputs of a circuit 50c, which corresponds to one of the circuits 50a or 50b. The first partial signal generator 51 is accordingly connected to the low-pass input terminal 20a, while the second partial signal generator 52 is connected to the high-pass input terminal 20b. The circuit 50c processes one of the two signals selectively and reroutes it to its output terminal 26.

The invention is not restricted to the exemplary embodiment illustrated. All of the features described above or shown in the drawings can be advantageously combined with one another as required within the scope of the invention.

We claim:

1. An electronic circuit comprising: a high-pass and a low-pass, wherein the low-pass includes at least one low-pass series element and one low-pass transverse element, wherein the high-pass includes at least one high-pass series element and one high-pass transverse element, wherein the low-pass series element and the high-pass transverse element are realized by a common component, and/or wherein the high-pass series element and the low-pass transverse element are realized by a common component, wherein a high-pass input terminal and a low-pass input terminal are separate input terminals.

2. The electronic circuit according to claim 1,
wherein the low-pass series element and the high-pass transverse element are realized by a common inductive component, and/or
wherein the high-pass series element and the low-pass transverse element are realized by a common capacitive component.

3. The electronic circuit according to claim 1, further comprising:
a switch element, which is embodied to connect alternately a high-pass connecting point of the high-pass and a low-pass connecting point of the low-pass, to ground.

4. The electronic circuit according to claim 3,
wherein the electronic circuit shows a low-pass behavior when the high-pass connecting point is connected to the ground, and
wherein the electronic circuit shows a high-pass behavior when the low-pass connecting point is connected to the ground.

5. The electronic circuit according to claim 3,
wherein the high-pass connecting point is disposed at an input end of the high-pass series element, and
wherein the low-pass connecting point is disposed at an input end of the low-pass series element.

6. The electronic circuit according to claim 3,
wherein the switch element is realized either by a two-way switch or by two switches.

7. The electronic circuit according to claim 6,
wherein the two switches are PIN diodes or transistors.

8. The electronic circuit according to claim 6,
wherein the two switches are PIN diodes and the PIN diodes each include a switch connection, which is embodied to switch the PIN diodes into a blocked state and into a conductive state.

9. The electronic circuit according to claim 1,
wherein the high-pass is connected to the high-pass input terminal,
wherein the low-pass is connected to the low-pass input terminal, and
wherein the electronic circuit includes a common output terminal.

10. A signal generator with a first partial signal generator and a second partial signal generator, comprising an electronic circuit according to claim 1.

11. The signal generator according to claim 10,
wherein the first partial signal generator generates a first signal,
wherein the second partial signal generator generates a second signal,
wherein an output of the first partial signal generator and an output of the second partial signal generator is connected respectively either to the low-pass input terminal or to the high-pass input terminal, and wherein the electronic circuit is connected to the first partial signal generator and to the second partial signal generator so that the electronic circuit processes the first signal or the second signal in a selective manner and outputs a resulting signal at an output terminal.

12. The signal generator according to claim 11,
wherein the first partial signal generator is a direct digital signal generator,
wherein the second partial signal generator is a signal generator based on a phase-locked loop, and
wherein the first signal provides a lower maximum frequency than the second signal.

* * * * *